Oct. 7, 1952

K. N. FROMM 2,613,285

BALANCED INPUT HIGH-FREQUENCY AMPLIFIER

Filed Aug. 16, 1946

INVENTOR
KENNETH N. FROMM

BY [signature]

ATTORNEY

Patented Oct. 7, 1952 2,613,285

UNITED STATES PATENT OFFICE 2,613,285

BALANCED INPUT HIGH-FREQUENCY AMPLIFIER

Kenneth N. Fromm, Fort Wayne, Ind., assignor, by mesne assignments, to Farnsworth Research Corporation, a corporation of Indiana Application August 16, 1946, Serial No. 690,877½

9 Claims. (Cl. 179—171)

Figure 1:
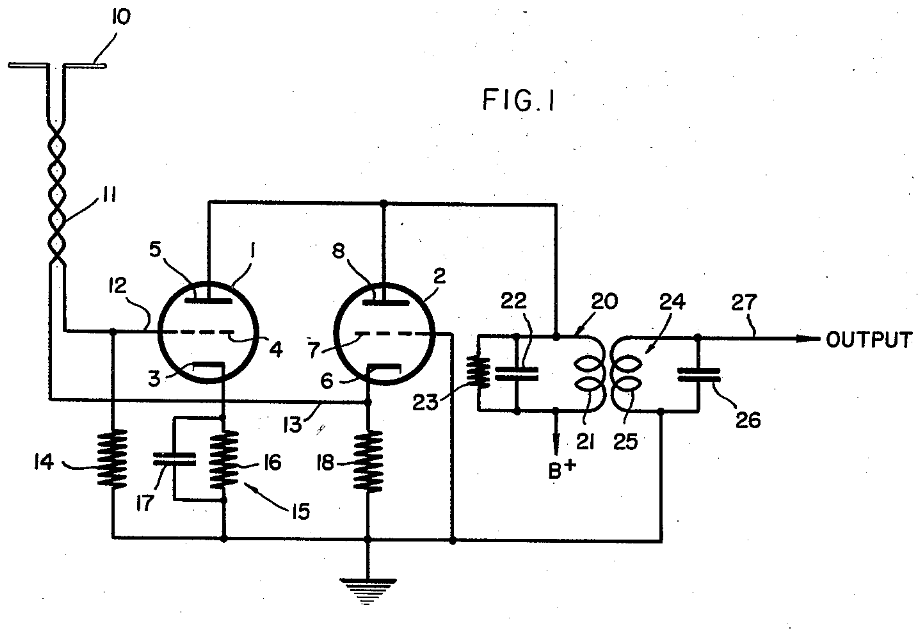

This invention relates to high-frequency amplifiers and particularly relates to an amplifier having a balanced input circuit and an unbalanced output circuit.

A television receiving antenna is conventionally connected to the receiver through a transmission line. Such a transmission line may either be a coaxial cable which is unbalanced, or a twisted pair of wires or an open wire line, both of which are balanced with respect to a fixed reference potential. In view of its higher cost and the difficulties encountered in installing it a coaxial cable is usually not utilized for connecting a television antenna to the receiver. However, a transmission line consisting of either a twisted pair of wires or of an open wire line is comparatively cheap and is easy to install. A twisted pair of wires has a comparatively high loss but is relatively insensitive to interference when properly balanced. An open wire line on the other hand may be made with a high impedance and is therefore useful for connecting an antenna having a high radiation resistance with the receiver. Furthermore, an open wire line has low losses but will pick up a certain amount of interference signals.

When a balanced transmission line of the type discussed hereinabove is utilized for connecting a receiving antenna to a television receiver, a radio frequency amplifier stage is required which has a balanced input circuit and an unbalanced output circuit for coupling the amplifier to another radio frequency amplifier stage or to the converter stage of the receiver. Such a balanced-input unbalanced-output high-frequency amplifier should have a high gain and should be able to pass a wide-band signal when used in a television receiver. Furthermore, the gain of the amplifier for an undesired in-phase input voltage which may, for example, represent noise or interference picked up by the balanced transmission line should be very low and preferably zero. Thus, the amplifier should have a good voltage balance, that is, the individual gains obtained from each terminal of the balanced signal voltage source should be equal.

It has been suggested to provide a balanced-input unbalanced-output amplifier where the two terminals of the balanced signal voltage source are connected respectively to the grid and to the cathode of one triode having a cathode impedance. The amplifier, accordingly, has cathode and grid feed. Such a push-pull single-ended amplifier, however, has a poor voltage balance even though the impedances are matched, and consequently, its gain with respect to two in-phase input voltages is considerably larger than unity.

It is an object of the present invention, therefore, to provide a novel amplifier suitable for amplifying high-frequency signals which has a balanced input circuit and an unbalanced output circuit.

A further object of the invention is to provide a balanced-input high-frequency amplifier which will amplify a wide-band signal with high gain and which has a good voltage balance and will provide a gain of less than unity for an undesired in-phase input signal.

In accordance with the present invention there is provided a high-frequency amplifier comprising a first and a second electric discharge device, each having a grid, a cathode and an anode. There is further provided a source of signal voltages balanced with respect to a fixed potential and coupled to the grid of the first discharge device and to the cathode of the second discharge device. A cathode impedance is provided in the cathode circuit of the second discharge device. Furthermore, there are provided an anode voltage supply and a common anode impedance for connecting the voltage supply to the anodes of the two discharge devices. Finally, means are provided for deriving an unbalanced amplified output signal across the anode impedance.

For a better understanding of the invention, together with other and further objects thereof, reference is made to the following description, taken in connection with the accompanying drawing, and its scope will be pointed out in the appended claims.

Figure 2:
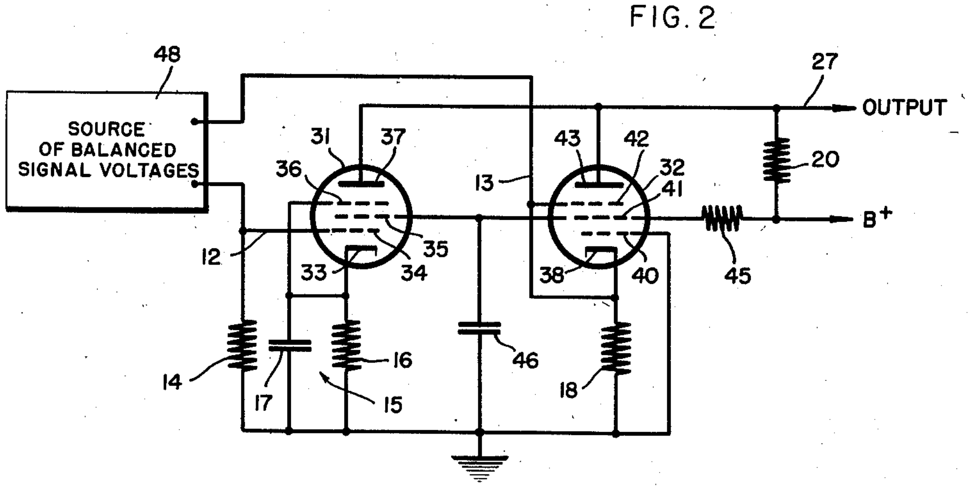

In the accompanying drawing, Fig. 1 is a circuit diagram of a balanced-input high-frequency amplifier embodying the present invention, while Fig. 2 is a circuit diagram of a modified amplifier in accordance with the invention and suitable for amplifying higher frequency signals than the amplifier of Fig. 1.

Referring to Fig. 1 of the drawing, there is illustrated a high-frequency amplifier stage comprising triodes 1 and 2. Triode 1 includes cathode 3, control grid 4 and anode 5 while triode 2 comprises cathode 6, control grid 7 and anode 8. There is provided a source of balanced signal voltages which in Fig. 1 has been illustrated, by way of example, by dipole 10 connected to the amplifier through balanced transmission line 11 which, as shown, may consist of a twisted pair of wires. Instead of using a twisted pair of wires it is also feasible to utilize an open wire line which has considerably lower losses than a twisted pair of wires but which will more readily pick up interference signals.

Balanced transmission line 11 has two output terminals 12 and 13 which are connected respectively to control grid 4 of triode 1 and to cathode 6 of triode 2. It will be appreciated that at any instant the signal voltage appearing at terminal 12 is in phase opposition with respect to the signal voltage developed at terminal 13, both of which are balanced with respect to a fixed reference potential, such as ground.

Control grid 4 of triode 1 is connected to ground through grid leak resistor 14. Cathode 3 of triode 1 is connected to ground through a biasing network 15 which may consist of resistor 16 by-passed by condenser 17 to provide proper grid bias. Control grid 7 of triode 2 is kept at a fixed potential, such as ground. Cathode 6 of triode 2 is connected to ground through cathode resistor 18. Triode 2 is thus arranged as a grounded-grid cathode-feed amplifier.

Anodes 5 and 8 are connected to a suitable anode voltage supply indicated at B+ through common anode impedance 20 which may comprise a tuned circuit including coil 21 and condenser 22. For the purpose of obtaining the desired band-pass damping resistor 23 may be provided in the anode circuit and may be arranged in parallel with tuned circuit 21, 22. The unbalanced output signal may be derived from tuned output circuit 24 comprising coil 25 inductively coupled to coil 21 and connected across condenser 26. One terminal of output coil 25 may be grounded, as shown, and the unbalanced output signal may be obtained from output lead 27 connected to the opposite terminal of coil 25. It is to be understood that damping resistor 23 may also be connected across tuned output circuit 24 in which case its resistance is reflected back into anode impedance 20.

The operation of the amplifier illustrated in Fig. 1 will be evident. The signal voltages developed at terminals 12 and 13 are at any instant in phase opposition. Since terminal 12 is connected to the grid of triode 1 while terminal 13 is connected to the cathode of triode 2, the voltages of anodes 5 and 8 are in phase. The amplified unbalanced output signal may accordingly be developed across anode impedance 20 and may be obtained by means of tuned output circuit 25, 26.

The input resistances 14 and 18 of the amplifier must be properly matched to balanced transmission line 11. From this assumption an equation may be developed which determines the resistance of cathode resistor 18, and the gain of the amplifier may be calculated. If 2Z is the impedance of transmission line 11 as seen from its output terminals 12 and 13, the input impedance of control grid 4 of triode 1 that is, the impedance of grid leak resistor 14 should equal Z and the input impedance of cathode 6 of triode 2 should also equal Z. Thus, the following formula is obtained:

$$(1)\qquad Z=\frac{R_P R_K(R_P+2R_L)}{R_P[R_P+2R_L+R_K(1+\mu)]+R_L R_K}$$

In Formula 1 $R_K$ is the resistance of cathode resistor 18; $R_L$ is the resistive component of load or anode impedance 20; $\mu$ is the amplification factor of either of triodes 1 and 2 which is defined as the ratio of the change in plate voltage to a change in grid voltage with constant plate current; and $R_P$ is the dynamic plate resistance which is defined as the ratio of the amplification factor over the mutual inductance of either triode 1 or 2. In order to match balanced transmission line 11 to the input circuit of triode 1, the resistance of grid leak resistor 14 should equal Z as stated. Formula 1 may be solved for $R_K$:

$$(2)\qquad R_K=\frac{ZR_P(R_P+2R_L)}{R_P(R_P+2R_L)-Z[R_P(1+\mu)+R_L]}$$

The gain A defined as the ratio of output voltage over input voltage may be obtained from the following formula:

$$(3)\qquad A=\left|\frac{R_L[R_P(R_K-Z)+\mu Z R_K]}{2ZR_K(R_P+R_L)}\right|$$

Let it be assumed that a 7F8 type twin tube is used for triodes 1 and 2 which has an amplification factor $\mu=50$ and a dynamic plate resistance $R_P=10{,}000$ ohms. It may also be assumed that the input impedance $Z=60$ ohms and the load resistance $R_L=2{,}000$ ohms. The value of the resistance $R_K$ of cathode resistor 18 may accordingly be calculated from Formula 2 and amounts to 76 ohms. The gain as evaluated from Formula 3 with the above values is $A=7$ which compares with a value of 7 found experimentally with the circuit of Fig. 1. The gain of the amplifier with the above circuit constants when the voltage impressed upon control grid 4 and cathode 6 is equal and in phase amounts to less than unity. The amplifier, therefore has a good voltage balance.

The circuit of Fig. 1 may be used for amplifying an input signal in the frequency range from approximately 40 megacycles to approximately 100 megacycles. The amplifier of Fig. 1 is accordingly well adapted as a radio frequency amplifier stage in a television receiver for receiving the television channels provided in the frequency range from 44 to 88 megacycles.

A modified amplifier which is adapted to amplify signals in a higher frequency range is illustrated in Fig. 2. Thus, the amplifier of Fig. 2 is particularly useful as the radio frequency amplifier stage of a television receiver arranged for receiving another group of television channels provided in the frequency range from 174 to 216 megacycles. In Fig. 2, in which like components are designated by the same reference numerals as were used in Fig. 1, there are shown two pentodes 31 and 32 which replace triodes 1 and 2 of the circuit of Fig. 1.

Pentode 31 comprises cathode 33, control grid 34, screen grid 35, suppressor grid 36 and anode 37. Pentode 32 includes cathode 38, control grid 40, screen grid 41, suppressor grid 42 and anode 43. Cathode 33 of pentode 31 may be connected to ground through biasing network 15. Suppressor grid 36 is connected to cathode 33. Cathode 38 of pentode 32 is connected to suppressor grid 42 and may be connected to ground through cathode resistor 18. Screen grids 35 and 41 of the two pentodes are tied together and connected to anode voltage supply B+ through screen grid resistor 45 to supply them with a suitable positive potential. Screen grids 35 and 41 may furthermore be connected to ground through coupling condenser 46 to provide an alternating current bypass.

Anodes 37 and 43 are connected to anode voltage B+ through anode impedance 20 which has been represented as a resistor across which the output signal is developed and obtained from output lead 27. Control grid 40 of pentode 42 is connected to ground, while control grid 34 of pentode 31 is connected to ground through grid leak resistor 14. Input terminals 12 and 13 which are connected respectively to control grid 34 and to cathode 38 are connected, in turn, to a source of balanced signal voltages indicated at 48.

The circuit of Fig. 2 operates in substantially the same manner as the circuit of Fig. 1 so that further explanation is deemed to be unnecessary here. By replacing triodes 1 and 2 of the circuit of Fig. 1 by pentodes 31 and 32, the amplifier may be used for amplifying considerably higher frequencies, that is, up to at least 220 megacycles.

While there has been described what is at present considered the preferred embodiment of the invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A high-frequency amplifier comprising a first and a second electric discharge device, each having a grid, a cathode and an anode, a source of signal voltages balanced with respect to a fixed potential and coupled to the grid of said first device and to the cathode of said second device, a cathode impedance in the cathode circuit of said second device, an anode voltage supply, a common anode impedance for connecting said voltage supply to the anodes of said devices, and means for deriving an unbalanced amplified output signal across said anode impedance.

2. A high-frequency amplifier comprising a first and a second electric discharge device, each having a grid, a cathode and an anode, a source of signal voltages balanced with respect to a fixed potential and coupled to the grid of said first device and to the cathode of said second device, a cathode impedance in the cathode circuit of said second device, the grid of said second device being kept at a fixed potential, an anode voltage supply, a common anode impedance for connecting said voltage supply to the anodes of said devices, and means for deriving an unbalanced amplified output signal across said anode impedance.

3. A high-frequency amplifier comprising a first and a second electric discharge tube, each having a grid, a cathode and an anode, a source of signal voltages balanced with respect to a fixed potential and coupled to the grid of said first tube and to the cathode of said second tube, a cathode resistor in the cathode circuit of said second tube, means for biasing the grid of said first tube with respect to its cathode, means for keeping the grid of said second tube at a fixed potential, an anode voltage supply, a common anode impedance for connecting said voltage supply to the anodes of said tubes, and means for deriving an unbalanced amplified output signal across said anode impedance.

4. A high-frequency amplifier comprising a first and a second space discharge tube, each having a cathode, an anode and at least one grid, a source of balanced high-frequency signal voltage coupled to the grid of said first tube and to the cathode of said second tube, a biasing network connected to the cathode of said first tube, a cathode impedance connected to the cathode of said second tube, means for keeping the grid of said second tube at a fixed potential, a positive voltage supply, an anode impedance connected between said voltage supply and said anodes, and means for deriving an unbalanced amplified output signal from said anode impedance.

5. A high-frequency amplifier comprising a first and a second space discharge tube, each having a cathode, an anode and at least one grid, a source of balanced high-frequency signal voltage coupled to the grid of said first tube and to the cathode of said second tube, a cathode impedance connected to the cathode of said second tube, means for biasing the grid of said first tube with respect to its cathode, means for keeping the grid of said second tube at a fixed potential, a positive voltage supply, an anode impedance including a tuned circuit connected between said voltage supply and said anodes, and means for deriving an unbalanced amplified output signal from said tuned circuit.

6. A high-frequency amplifier comprising a first and a second space discharge tube, each having a cathode, an anode and at least one grid, a source of balanced high-frequency signal voltage coupled to the grid of said first tube and to the cathode of said second tube, a biasing network connected to the cathode of said first tube, a cathode resistor connected to the cathode of said second tube, means for keeping the grid of said second tube at a fixed potential, a positive voltage supply, a tuned circuit connected between said voltage supply and said anodes, and means for deriving an unbalanced amplified output signal from said tuned circuit.

7. A high-frequency amplifier comprising a first and a second triode, each having a cathode, an anode and a control grid, a source of balanced high-frequency signal voltage coupled to the control grid of said first triode and to the cathode of said second triode, a resistor bypassed by a condenser arranged in the cathode circuit of said first triode, a cathode resistor arranged in the cathode circuit of said second triode, a positive voltage supply, an anode impedance connected between said voltage supply and the anodes of said triodes, the control grid of said second triode being kept at a fixed potential, and means for deriving an unbalanced amplified output signal across said anode impedance.

8. A high-frequency amplifier comprising a first and a second pentode, each having a cathode, an anode, a control grid, a screen grid and a suppressor grid, a source of balanced high-frequency signal voltage coupled to the control grid of said first pentode and to the cathode of said second pentode, the suppressor grid of each pentode being connected to its associated cathode, a resistor bypassed by a condenser arranged in the cathode circuit of said first pentode, a cathode resistor arranged in the cathode circuit of said second pentode, means for supplying said screen grids with a positive voltage, a positive voltage supply, an anode impedance connected between said voltage supply and the anodes of said pentodes, means for keeping the control grid of said second pentode at a fixed potential, and means for deriving an unbalanced amplified output signal across said anode impedance.

9. A high-frequency amplifier comprising a first and a second pentode, each having a cathode, an anode, a control grid, a screen grid and a suppressor grid, a source of balanced high-frequency signal voltage coupled to the control grid of said first pentode and to the cathode of said second pentode, the suppressor grid of each pentode being connected to its associated cathode, a resistor bypassed by a condenser arranged in the cathode circuit of said first pentode, a cathode resistor arranged in the cathode circuit of said second pentode, means for supplying said screen grids with a positive voltage, a positive voltage supply, an anode impedance including a tuned circuit connected between said voltage supply and the anodes of said pentodes, the control grid of said second pentode being kept at a fixed potential, and means for deriving an unbalanced amplified output signal across said tuned circuit.

KENNETH N. FROMM.

REFERENCES CITED

The following references are of record in the file of this patent:

UNITED STATES PATENTS

| Number | Name | Date |
|---|---|---|
| 2,199,820 | Gannett | May 7, 1940 |
| 2,230,546 | Rothe | Feb. 4, 1941 |
| 2,246,331 | White et al. | June 17, 1941 |
| 2,256,084 | Goodale et al. | Sept. 16, 1941 |
| 2,256,085 | Goodale | Sept. 16, 1941 |